(12) United States Patent
Odnoblyudov et al.

(10) Patent No.: US 8,598,611 B2
(45) Date of Patent: Dec. 3, 2013

(54) VERTICAL SOLID-STATE TRANSDUCERS AND SOLID-STATE TRANSDUCER ARRAYS HAVING BACKSIDE TERMINALS AND ASSOCIATED SYSTEMS AND METHODS

(75) Inventors: Vladimir Odnoblyudov, Eagle, ID (US); Martin F. Schubert, Boise, ID (US); Scott D. Schellhammer, Meridian, ID (US); Jeremy S. Frei, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/346,495

(22) Filed: Jan. 9, 2012

(65) Prior Publication Data

US 2013/0175560 A1 Jul. 11, 2013

(51) Int. Cl.
*H01L 33/00* (2010.01)
(52) U.S. Cl.
USPC ............ 257/98; 257/13; 257/28; 257/79; 257/99; 257/E33.01; 257/E33.062; 257/E33.065; 257/E33.068; 428/29
(58) Field of Classification Search
USPC .......... 257/13, 28, 79, 98, 99, 102, E33.01, 257/E33.062, E33.065, E33.068, E21.529; 438/14, 29
See application file for complete search history.

(56) References Cited

U.S. PATENT DOCUMENTS

| | | | |
|---|---|---|---|
| 8,319,230 B1* | 11/2012 | Dutta | 257/82 |
| 2003/0168664 A1 | 9/2003 | Hahn et al. | |
| 2005/0173692 A1 | 8/2005 | Park et al. | |
| 2009/0236686 A1* | 9/2009 | Shim et al. | 257/528 |
| 2010/0117096 A1 | 5/2010 | Yoo et al. | |
| 2010/0314651 A1 | 12/2010 | Lin | |
| 2012/0153253 A1* | 6/2012 | Kimura et al. | 257/13 |
| 2012/0241724 A1* | 9/2012 | Tsang | 257/28 |
| 2012/0286240 A1* | 11/2012 | Yu et al. | 257/13 |

* cited by examiner

*Primary Examiner* — Asok K Sarkar
(74) *Attorney, Agent, or Firm* — Perkins Coie LLP

(57) ABSTRACT

Solid-state transducers ("SSTs") and SST arrays having backside contacts are disclosed herein. An SST in accordance with a particular embodiment can include a transducer structure having a first semiconductor material at a first side of the transducer structure, and a second semiconductor material at a second side of the transducer structure. The SST can further include a first contact at the first side and electrically coupled to the first semiconductor material, and a second contact extending from the first side to the second semiconductor material and electrically coupled to the second semiconductor material. A carrier substrate having conductive material can be bonded to the first and second contacts.

30 Claims, 14 Drawing Sheets

VERTICAL SOLID-STATE TRANSDUCERS AND SOLID-STATE TRANSDUCER ARRAYS HAVING BACKSIDE TERMINALS AND ASSOCIATED SYSTEMS AND METHODS

TECHNICAL FIELD

The present technology is related to solid-state transducers and methods of manufacturing solid-state transducers and solid-state transducer arrays. In particular, the present technology relates to vertical solid-state transducers having backside terminals and associated systems and methods.

BACKGROUND

Solid state lighting ("SSL") devices are used in a wide variety of products and applications. For example, mobile phones, personal digital assistants ("PDAs"), digital cameras, MP3 players, and other portable electronic devices utilize SSL devices for backlighting. SSL devices are also used for signage, indoor lighting, outdoor lighting, and other types of general illumination. SSL devices generally use light emitting diodes ("LEDs"), organic light emitting diodes ("OLEDs"), and/or polymer light emitting diodes ("PLEDs") as sources of illumination, rather than electrical filaments, plasma, or gas. FIG. 1A is a cross-sectional view of a conventional SSL device 10a with lateral contacts. As shown in FIG. 1A, the SSL device 10a includes a substrate 20 carrying an LED structure 11 having an active region 14, e.g., containing gallium nitride/indium gallium nitride (GaN/InGaN) multiple quantum wells ("MQWs"), positioned between N-type GaN 15 and P-type GaN 16. The SSL device 10a also includes a first contact 17 on the P-type GaN 16 and a second contact 19 on the N-type GaN 15. The first contact 17 typically includes a transparent and conductive material (e.g., indium tin oxide ("ITO")) to allow light to escape from the LED structure 11. In operation, electrical power is provided to the SSL device 10a via the contacts 17, 19, causing the active region 14 to emit light.

FIG. 1B is a cross-sectional view of another conventional LED device 10b in which the first and second contacts 17 and 19 are opposite each other, e.g., in a vertical rather than lateral configuration. During formation of the LED device 10b, a growth substrate (not shown), similar to the substrate 20 shown in FIG. 1A, initially carries an N-type GaN 15, an active region 14 and a P-type GaN 16. The first contact 17 is disposed on the P-type GaN 16, and a carrier 21 is attached to the first contact 17. The substrate is removed, allowing the second contact 19 to be disposed on the N-type GaN 15. The structure is then inverted to produce the orientation shown in FIG. 1B. In the LED device 10b, the first contact 17 typically includes a reflective and conductive material (e.g., silver or aluminum) to direct light toward the N-type GaN 15. A converter material 23 and an encapsulant 25 can then be positioned over one another on the LED structure 11. In operation, the LED structure 11 can emit a first emission (e.g., blue light) that stimulates the converter material 23 (e.g., phosphor) to emit a second emission (e.g., yellow light). The combination of the first and second emissions can generate a desired color of light (e.g., white light).

The vertical LED device 10b typically has enhanced current spreading, light extraction and thermal properties, and accordingly a higher efficiency than the lateral LED device 10a of FIG. 1A. However, despite improved thermal properties, the LED device 10b still produces a significant amount of heat such that in at least some cases, the differences between the coefficients of thermal expansion of the LED structure 11 and the underlying carrier substrate 21 can cause delamination between the two components and/or other damage to the packaged device. Additionally, as shown in FIG. 1B, the vertical LED device 10b requires access to both sides of the die to form electrical connections with the first and second contacts 17 and 19, and typically includes at least one wirebond coupled to the second contact 19. Wirebond connections take up more space and require more intricate formation techniques than other electrical coupling methods (e.g., solder reflow processes), and therefore may be ill-suited for applications with tight die spacing. Moreover, various portions of the LED device 10b (e.g., the converter material 23 and the encapsulant 25) are formed after singulation at a die level (FIG. 1B), and thus require precise handing that further increases manufacture time and cost. Accordingly, there remains a need for vertical LEDs, vertical LED arrays and other solid-state devices that facilitate packaging and have improved performance and reliability.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. Moreover, in the drawings, like reference numerals designate corresponding parts throughout the several views.

DETAILED DESCRIPTION

Specific details of several embodiments of solid-state transducers ("SSTs") and associated systems and methods are described below. The term "SST" generally refers to solid-state devices that include a semiconductor material as the active medium to convert electrical energy into electromagnetic radiation in the visible, ultraviolet, infrared, and/or other spectra. For example, SSTs include solid-state light emitters (e.g., LEDs, laser diodes, etc.) and/or other sources of emission other than electrical filaments, plasmas, or gases. SSTs can alternately include solid-state devices that convert electromagnetic radiation into electricity. Additionally, depending upon the context in which it is used, the term "substrate" can refer to a wafer-level substrate or to a singulated device-level substrate. A person skilled in the relevant art will also understand that the technology may have additional embodiments, and that the technology may be practiced without several of the details of the embodiments described below with reference to FIGS. 2A-8.

Figure 1A:
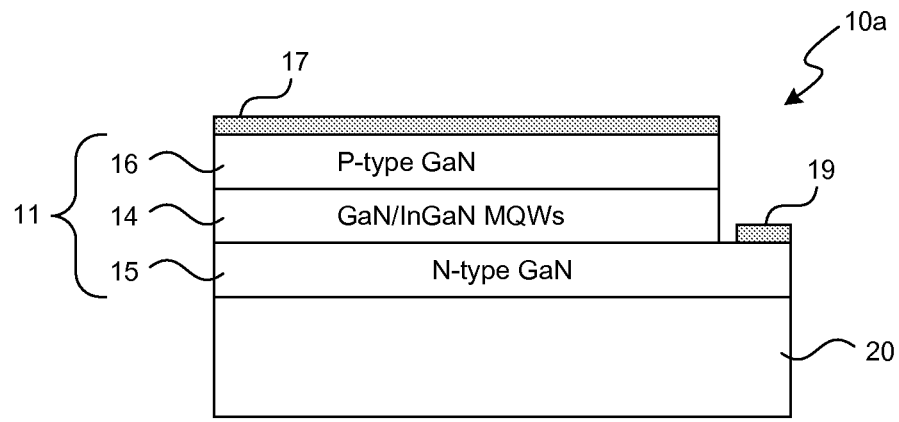
FIGS. 1A and 1B are schematic cross-sectional diagrams of LED devices configured in accordance with the prior art.
Figure 1B:
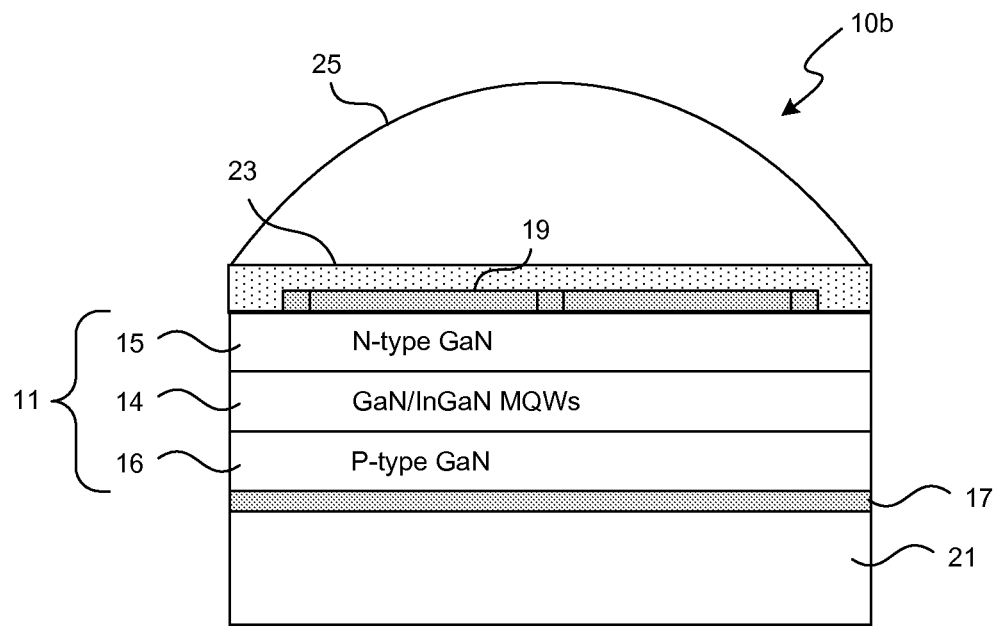
Figure 2A:
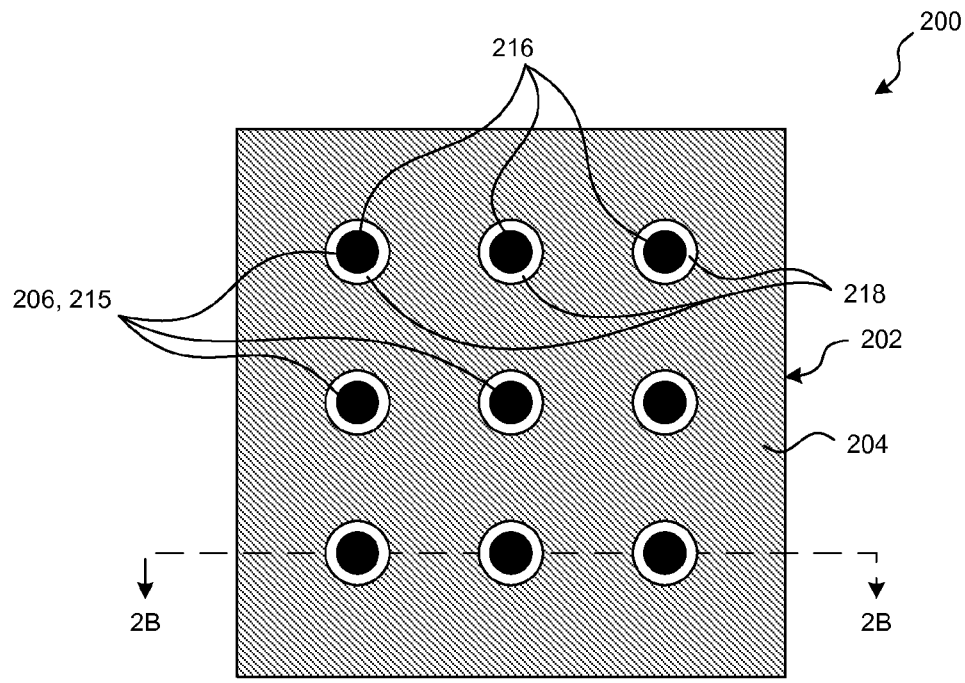
FIGS. 2A-2L are schematic plan and cross-sectional views illustrating portions of a process for forming solid-state transducers in accordance with embodiments of the present technology.

FIGS. 2A-4D are schematic plan and cross-sectional views illustrating a process for forming SSTs in accordance with an embodiment of the present technology. For example, FIGS. 2A and 2B illustrate an SST 200 at a stage of the process after a transducer structure 202 has been formed on a growth substrate 220. As shown in FIG. 2B, the SST 200 has a first side 201a and a second side 201b facing away from the first side 201a. The transducer structure 202 can include an active region 214, a first semiconductor material 210 and a second semiconductor material 212. A first contact 204 can be formed on the first semiconductor material 210. A second contact 206 can include a plurality of buried contact elements 215 that extend from the first side 201a of the SST 200 to or into the second semiconductor material 212. Accordingly, as shown in FIGS. 2A and 2B, both the first and second contacts 204 and 206 are electrically accessible from the first side 201a of the SST 200.

The first and second semiconductor materials 210 and 212 can be doped semiconductor materials. For example, the first semiconductor material 210 can be a P-type semiconductor material (e.g., P-GaN), and the second semiconductor material 212 can be an N-type semiconductor material (e.g., N-GaN). In other embodiments, the first and second semiconductor materials 210 and 212 may be reversed. The active region 214 between the first and second semiconductor materials 210 and 212 can include a single quantum well ("SQW"), MQWs, and/or a single grain semiconductor material (e.g., InGaN). In other embodiments, the transducer structure 202 can include other suitable semiconductor materials, such as gallium arsenide (GaAs), aluminum gallium arsenide (AlGaAs), gallium arsenide phosphide (GaAsP), etc.), and/or other semiconductor materials. The transducer structure 202 can be formed via metal organic chemical vapor deposition ("MOCVD"), molecular beam epitaxy ("MBE"), liquid phase epitaxy ("LPE"), and/or hydride vapor phase epitaxy ("HVPE"). In other embodiments, at least a portion of the transducer structure 202 may be formed using other suitable epitaxial growth techniques.

Figure 2B:
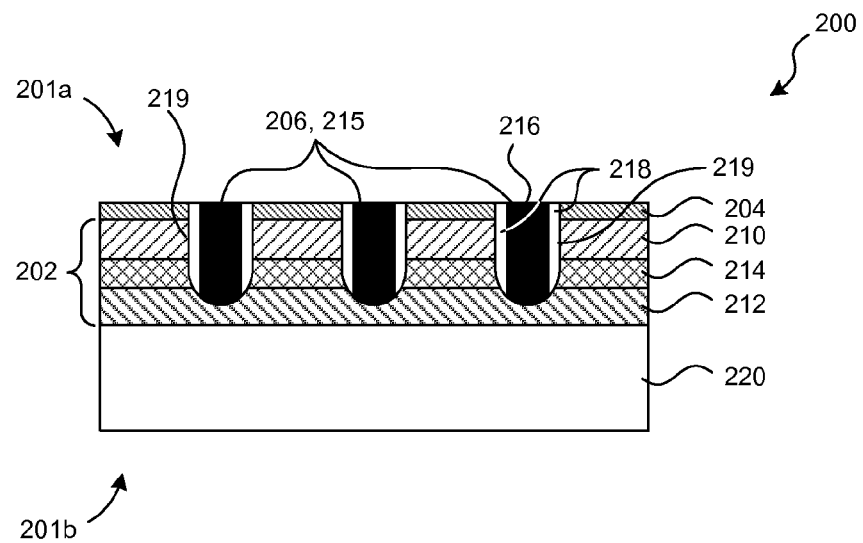

As shown in FIGS. 2A and 2B, the first contact 204 can extend over a large portion of the underlying first semiconductor material 210. In other embodiments, the first contact 204 can be formed over a smaller portion of the first semiconductor material 210. The first contact 204 can be made from a reflective contact material, including nickel (Ni), silver (Ag), copper (Cu), aluminum (Al), tungsten (W), and/or other reflective materials. During subsequent processing stages, the transducer structure 202 may be inverted such that the reflective first contact 204 can redirect emissions (e.g., light) back through the transducer structure 202 toward the second side 201b of the SST 200 (FIG. 2B). In other embodiments, the first contact 204 can be made from non-reflective materials, and the SST 200 can include separate reflective elements positioned at the first side 201a of the SST 200. In further embodiments, the SSTs 200 do not include reflective elements. The first contact 204 can be formed using chemical vapor deposition ("CVD"), physical vapor deposition ("PVD"), atomic layer deposition ("ALD"), spin coating, patterning, and/or other suitable techniques known in the semiconductor fabrication arts.

Referring to FIG. 2B, the buried contact elements 215 can be formed by etching or otherwise forming a plurality of features (e.g., trenches) 219 that extend from the first side 201a of the SST 200 (e.g., the first contact 204 or the first semiconductor material 210) to or into the second semiconductor material 212. For example, the trenches 219 can be formed before the first contact 204 and can extend to the backside of the second semiconductor material 212 (as shown in FIG. 2B). The sidewalls of the trenches 219 can be coated with a dielectric material 218, and a second contact material 216 can be disposed in the trenches 219 to electrically connect with exposed portions of the second semiconductor material 212 in the trenches 219. The dielectric material 218 can electrically insulate the second contact material 216 along a path extending through the first contact 204, the first semiconductor material 210, and the active region 214. The dielectric material 218 can include silicon dioxide ($SiO_2$), silicon nitride (SiN), and/or other suitable dielectric materials, and the second contact material 216 can include titanium (Ti), aluminum (Al), nickel (Ni), silver (Ag), and/or other suitable conductive materials. The second contact material 216 and the dielectric material 218 can be deposited using CVD, PVD, ALD, patterning, and/or other suitable techniques known in the art.

Figure 2C:
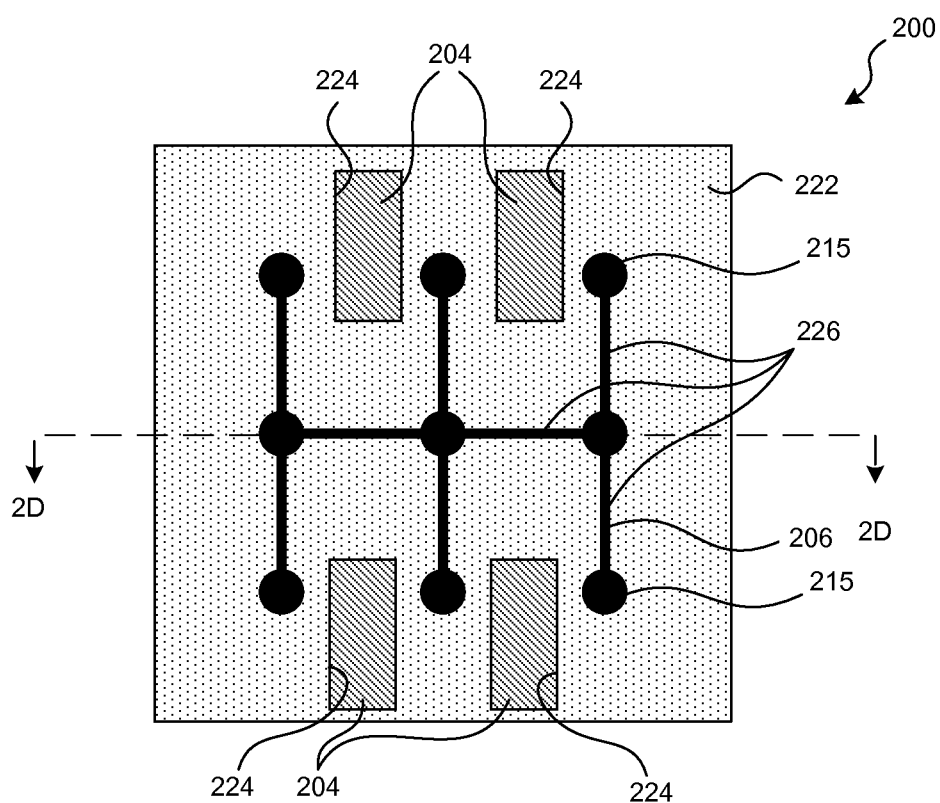
Figure 2D:
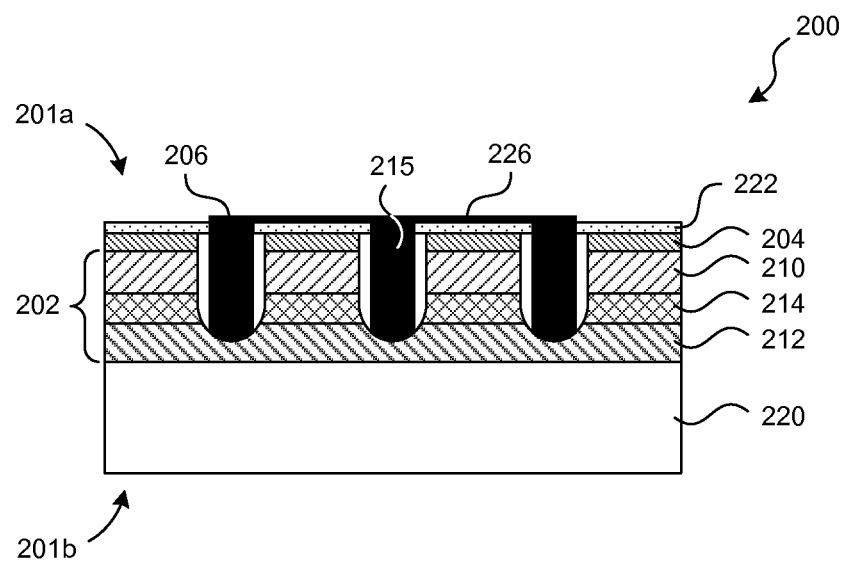

FIGS. 2C and 2D illustrate a stage in the process after a dielectric material 222 has been formed over the first contact 204. The dielectric material 222 can be the same as or different from the dielectric material 218 in the trenches 219. For example, the dielectric material 222 can include silicon nitride (SiN), silicon dioxide ($SiO_2$), and/or other suitable constituents. As shown in FIG. 2C, the dielectric material 222 can include openings 224 that expose portions of the first contact 204. In the illustrated embodiment, the dielectric material 222 includes four rectangular openings 224. In other embodiments, however, the dielectric material 222 can include more or fewer openings 224 and/or the openings 224 can have different shapes (e.g., square, circular, irregular, etc.). The dielectric material 222 can be formed using CVD, PVD, patterning, spin coating, and/or other suitable formation methods. The openings 224 can be formed by selectively depositing or selectively removing portions of the dielectric material 222.

As shown in FIGS. 2C and 2D, the dielectric material 222 does not cover the buried contact elements 215. In a particular embodiment, conductive lines 226 can be formed over the dielectric material 222 between the buried contact elements 215. The conductive lines 226 can be made from a suitable electrically conductive material, such as nickel (Ni), silver (Ag), copper (Cu), aluminum (Al), tungsten (W) and/or other suitable conductive materials. The conductive lines 226 can electrically couple and interconnect the buried contact elements 215 and form the second contact 206. The dielectric material 222 underlying the conductive lines 226 electrically isolates the first contact 204 from the second contact 206. The conductive lines 226 can be formed using deposition, patterning, and/or other suitable methods known in the art, and can be made from electrically conductive materials similar to those used for the second contact material 216.

Figure 2E:
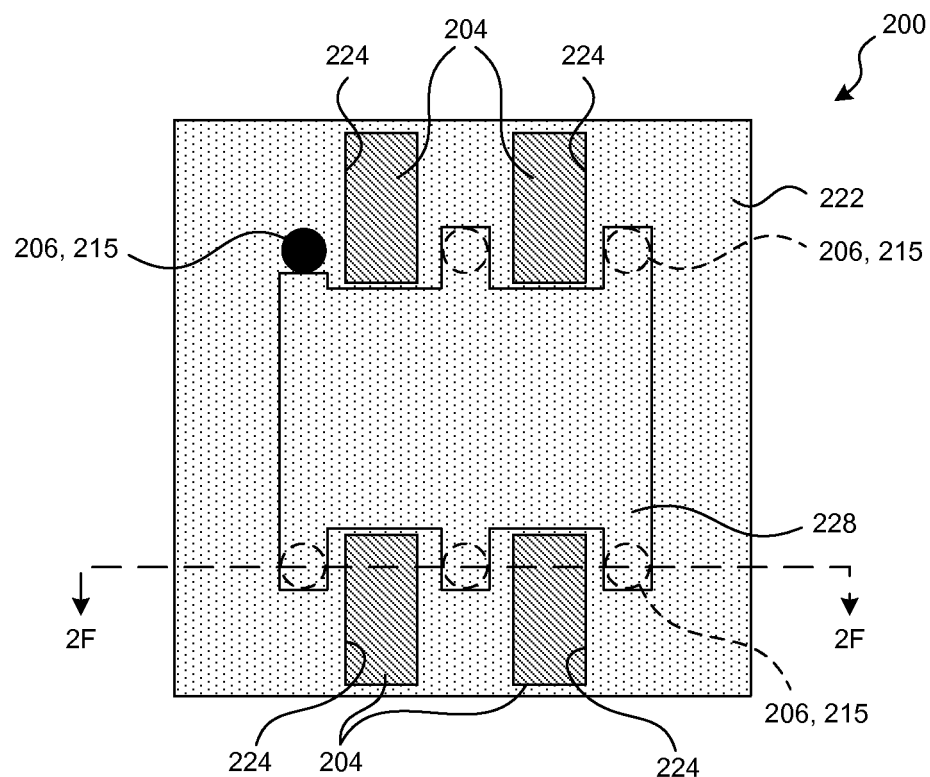
Figure 2F:
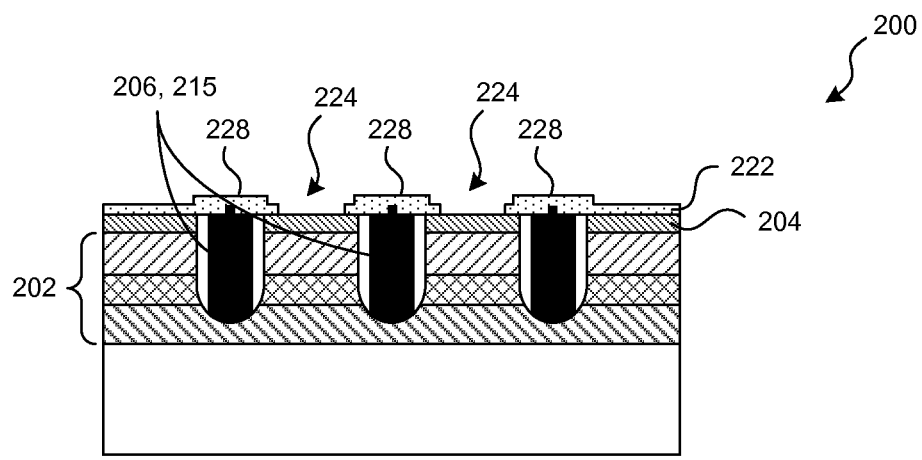

FIGS. 2E-2J illustrate stages in the process during which additional dielectric portions, conductive material, and additional conductive lines are added to the SST 200. As shown in FIGS. 2E and 2F, a first additional dielectric portion 228 can be selectively deposited (e.g., via CVD, PVD, or other suitable processes) over portions of the second contact 206 and/or pre-formed and positioned over portions of the second contact 206. In the illustrated embodiment, the first dielectric portion 228 is positioned over all but one of the buried contact elements 215. Additionally, the first dielectric portion 228 is positioned, deposited, patterned and/or otherwise configured so as not to cover the openings 224.

Figure 2G:
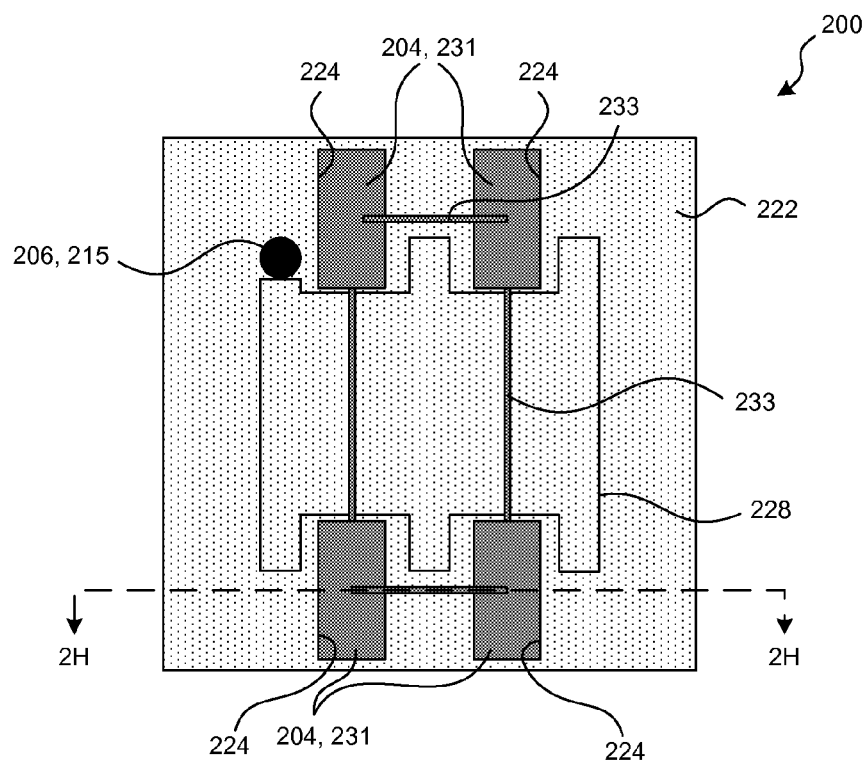
Figure 2H:
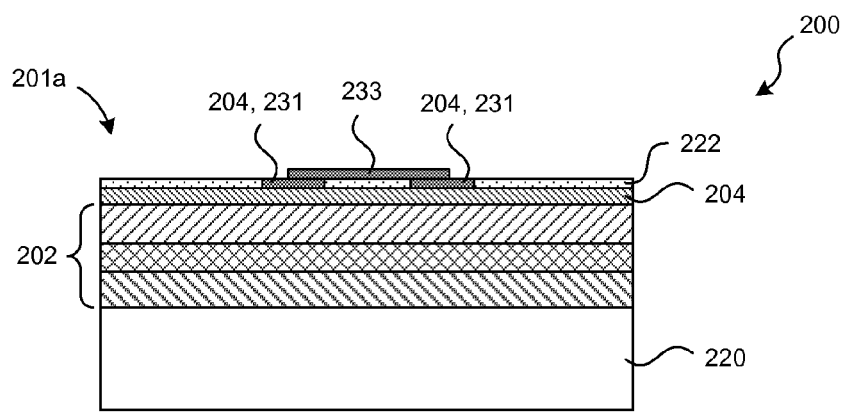

FIGS. 2G and 2H illustrate the addition of a conductive material 231 that can be deposited in the openings 224. The conductive material 231 can include titanium (Ti), aluminum (Al), nickel (Ni), silver (Ag), and/or other suitable conductive materials, and can be deposited using CVD, PVD, ALD, patterning, and/or other suitable techniques known in the art. The conductive material 231 fills the openings 224 and is electrically coupled to the first contact 204, thereby extending the first contact 204 through the dielectric material 222. Conductive lines 233 (e.g., Ni, Ag, Cu, Sn, Al, W, etc.) can be formed between portions of the conductive material 231 and can extend over the dielectric material 222 and the first dielectric portion 233.

Figure 2I:
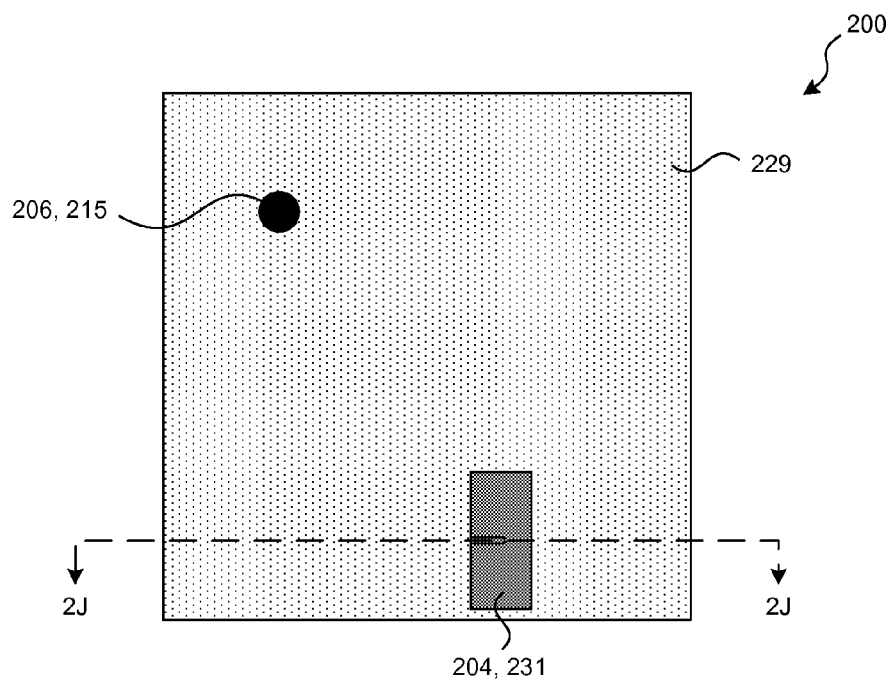
Figure 2J:
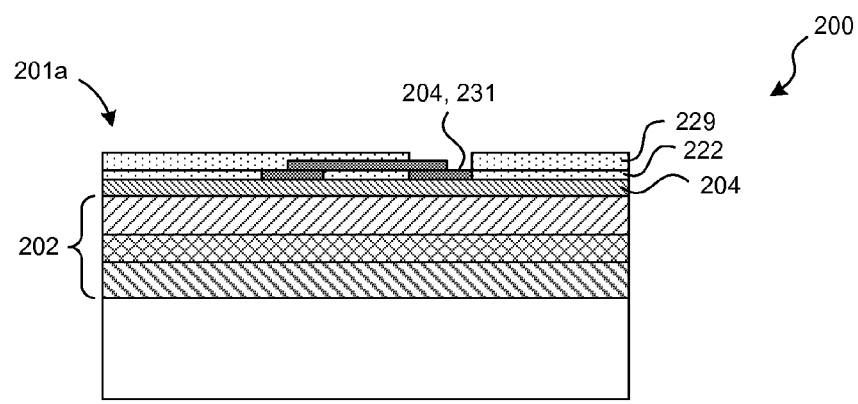
Figure 2K:
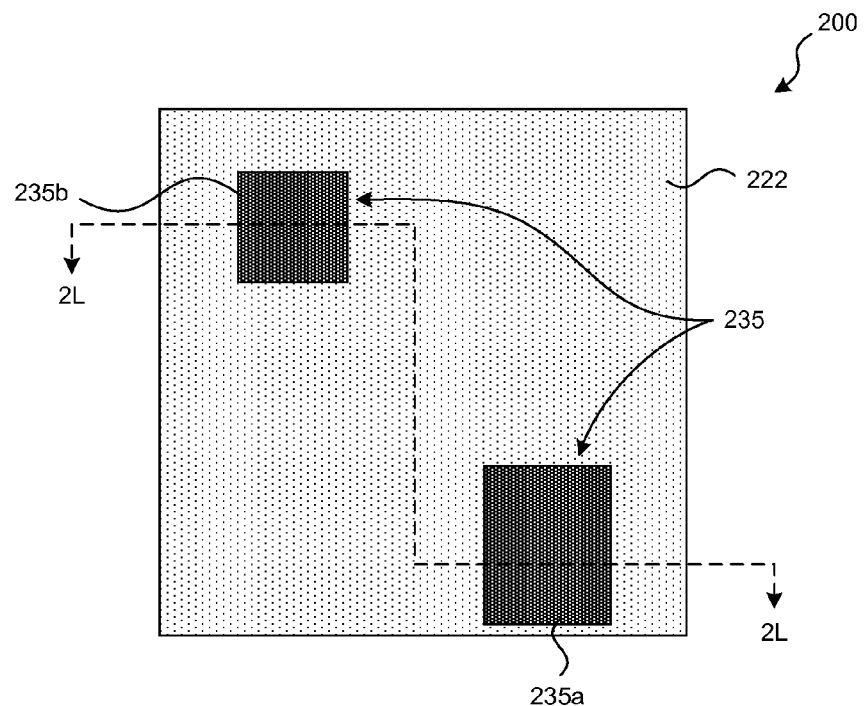
Figure 2L:
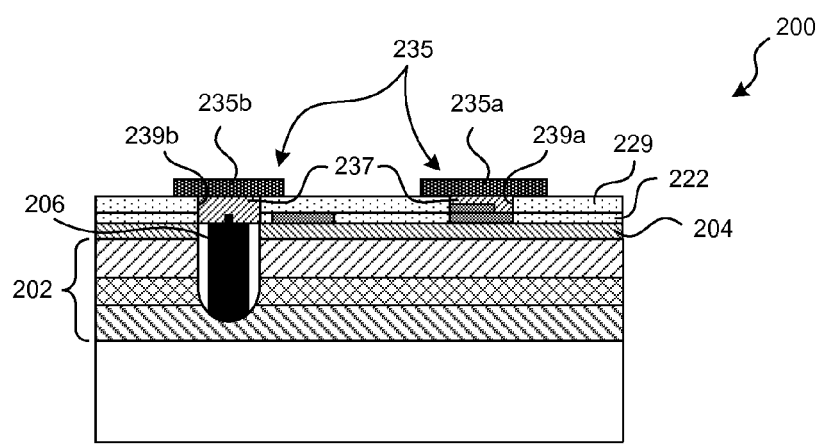

Referring next to FIGS. 2I and 2J, a second dielectric portion 229 can be selectively deposited on the first side 201a of the SST 200. In the illustrated embodiment, the second dielectric portion 229 covers the entire first side 201a, with the exception of one of the buried contact elements 215, and one portion of conductive material 231. In the illustrated embodiment, the second dielectric portion 229 is positioned to space the exposed first and second contacts 204 and 206 laterally apart from one another, and therefore reduces the likelihood of shorting the contacts to each other during subsequent processing. In other embodiments, the SSTs 200 can include larger or smaller dielectric portions 228 and 229 that cover larger or smaller portions of the first and second contacts 204 and 206. For example, the dielectric portions 228 and 229 can be deposited such that the entire second contact 206 is exposed.

The SST 200 can undergo further processing to add elements for attachment to additional substrates. In the illustrated embodiment of FIGS. 2K and 2L, bond pads 235 (e.g., a first bond pad 235a and a second bond pad 235b) can be electrically coupled to the first and second contacts 204 and 206, respectively. The bond pads 235 can be metal or metal alloy structures (e.g., Ni, Ag, Cu, Sn Al, W, etc.). Conductive material 237 can be deposited into a first opening 239a to electrically couple to the first contact 204, and additional conductive material 237 can be deposited into a second opening 239b to electrically couple to the second contact 206. Accordingly, the bond pads 235 can be electrically coupled to the first and second contacts 204 and 206 through the conductive material 237. Similar to the bond pads 235, the conductive material 237 can be a metal or a metal alloy.

Figure 3A:
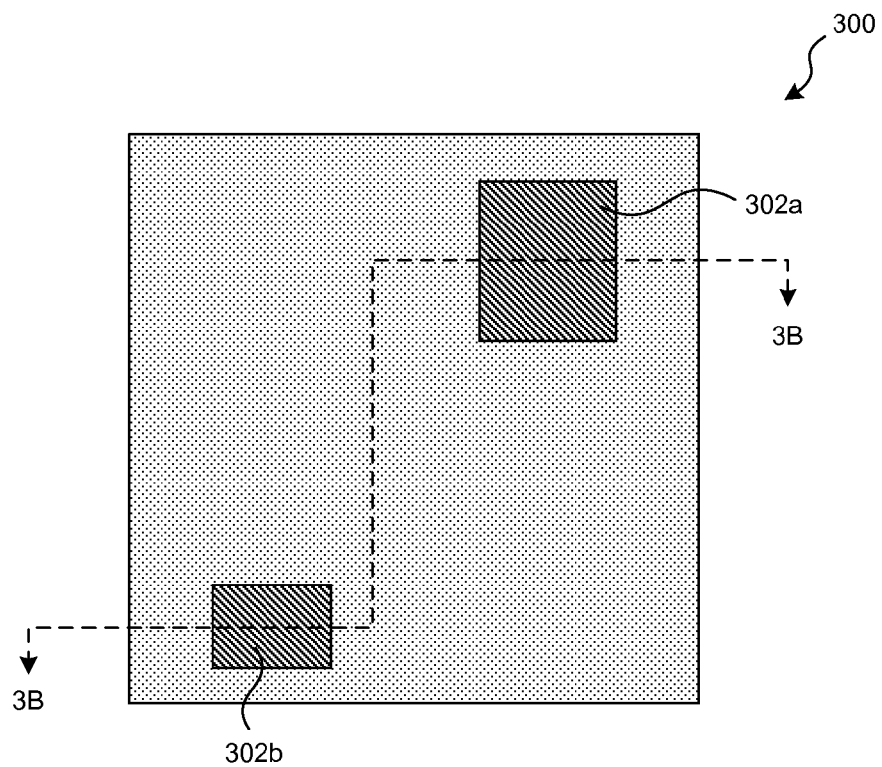
FIGS. 3A and 3B are schematic plan and cross-sectional views illustrating a process of forming a carrier substrate in accordance with another embodiment of the present technology.
Figure 3B:
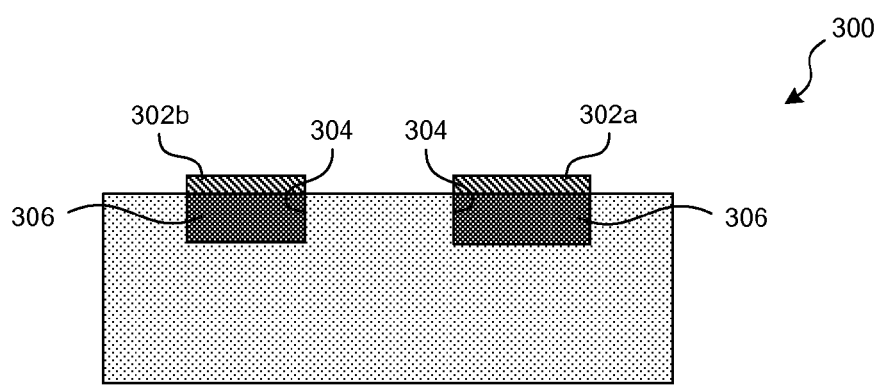

FIGS. 3A and 3B are schematic plan and cross-sectional views, respectively, of a carrier substrate 300 having bond pads 302 (e.g., a first bond pad 302a and a second bond pad 302b). Similar to the bond pads 235 described above with reference to FIGS. 2K and 2L, the bond pads 302 can include a metal or a metal alloy. In the illustrated embodiment, the carrier substrate 300 includes recesses 304 that can be filled with conductive material 306. The conductive material 306 can be a metal or a metal alloy, including plated copper. The bond pads 302 are deposited onto the conductive material 306, creating an electrical coupling between the bond pads 302 and the conductive material 306.

The SST 200 (FIG. 2L) can be attached to the carrier substrate 300 to provide electrical connections, and to provide a support for further processing on the second side 201b of the SST 200. FIGS. 4A-4D are schematic cross-sectional views of the SST 200 of FIG. 2L in various stages of processing, including bonding to the carrier substrate 300 of FIG. 3B.

Figure 4A:
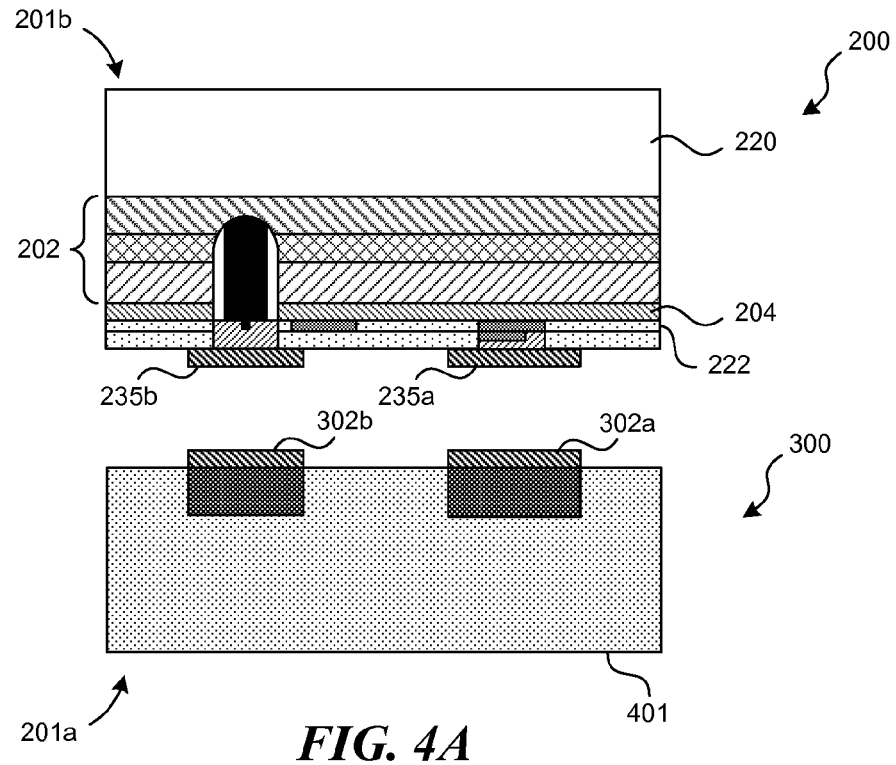
FIGS. 4A-4D are schematic cross-sectional views illustrating further portions of a process for forming solid-state transducers in accordance with further embodiments of the present technology.
Figure 4B:
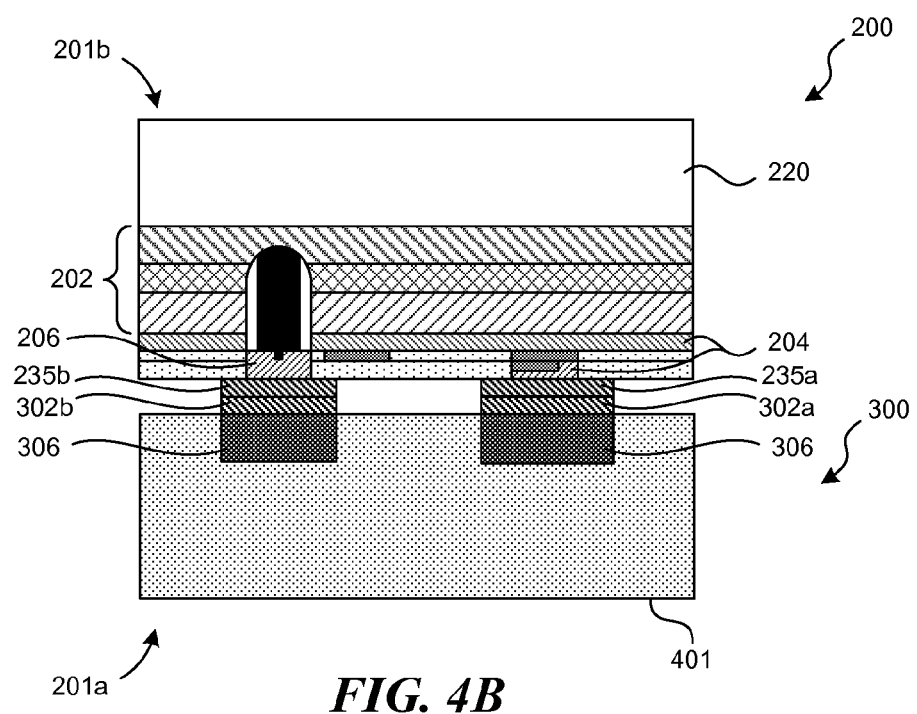

FIG. 4A illustrates the carrier substrate 300 and the SST 200 in alignment prior to bonding. In the illustrated embodiment, the SST 200 has been inverted, and the bond pads 235a, 235b of the SST 200 are aligned with the corresponding bond pads 302a, 302b of the carrier substrate 300. Optical alignment techniques and/or other semiconductor fabrication techniques can be used to align the SST 200 and the carrier assembly 300 in two orthogonal directions, and can be used to position the SST 200 and the carrier assembly 300 in parallel planes to facilitate consistent bonds between these assemblies. FIG. 4B illustrates the SST device 200 after it has been brought together and bonded to the carrier substrate 300 (e.g., using an elevated temperature process). Although the illustrated embodiment includes the bond pads 235a, 235b, 302a, 302b, in other embodiments, the conductive material 306 can be directly bonded to the first and second contacts 204 and 206. After bonding, the first side 201a of the SST device 200 includes an external surface 401, e.g., formed by an exposed outwardly-facing surface of the carrier substrate 300.

Figure 4C:
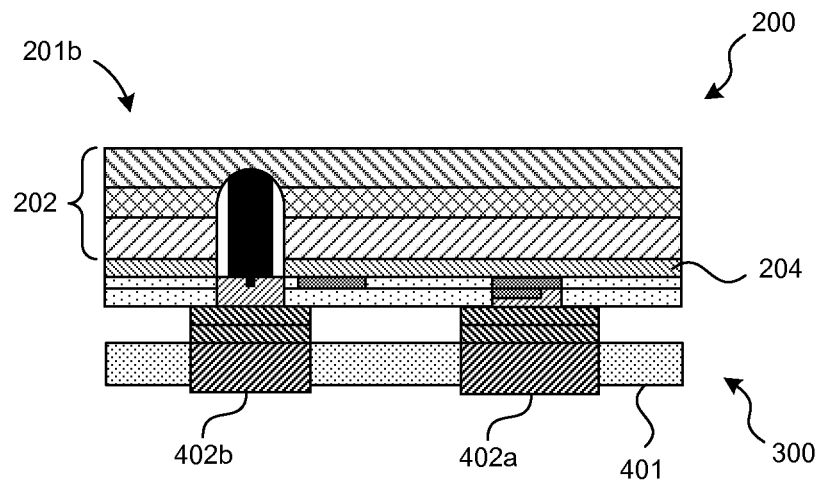

In the illustrated embodiment of FIG. 4C, the growth substrate 220 (FIG. 4B) has been removed, and the transducer structure 202 is exposed at the second side 201b of the SST 200. The growth substrate 220 can be removed by chemical-mechanical planarization (CMP), backgrinding, etching (e.g., wet etching, dry etching, etc.), and/or other removal techniques. Similarly, the external surface 401 can be ground or thinned by backgrinding, CMP, etching, and/or other suitable methods. The resulting SST 200 includes a first external contact 402a and a second external contact 402b that can be mounted on a board, a package or another component without requiring wire bonds e.g., using a solder reflow process. Accordingly, the external contacts 402 allow the SST 200 to be efficiently mounted to a board or other substrate or support in a single step process.

Figure 4D:
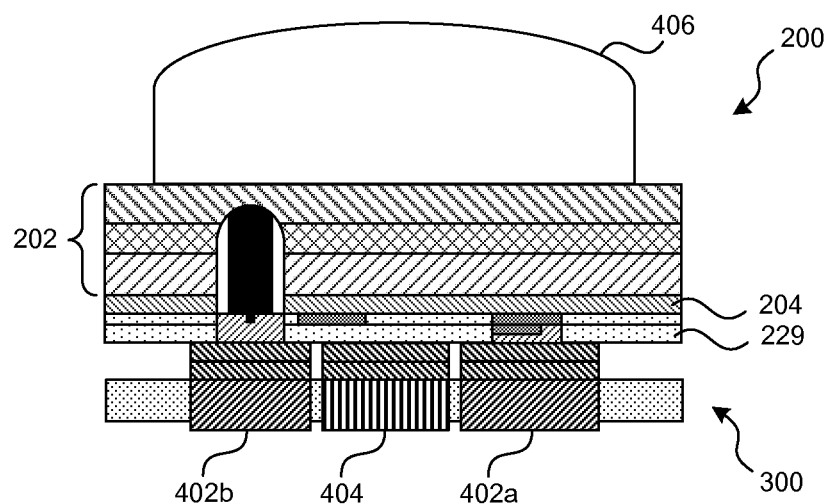

In further embodiments, the SST 200 can undergo additional processing to enhance or improve (e.g., optimize) optical properties, and/or other properties. In a particular embodiment, optical elements can be added to the SST 200. For example, FIG. 4D illustrates the SST 200 with a lens 406 disposed on the transducer structure 202. The lens 406 can be formed into different shapes to collimate, scatter, and/or otherwise diffract light or other emissions from the transducer structure 202. Accordingly, the lens 406 can include a suitable transmissive material, e.g., silicone, polymethylmethacrylate (PMMA), or resin. In some embodiments, the lens 406 can include an additional converter material (not shown) that converts light emitted by the transducer structure 202 at one frequency into light at a different frequency. In other embodiments, in addition to, or in place of the converter material, a converter element (not shown) can be added to the SST 200 to convert the frequency of the emitted light. In such an embodiment, the converter element can be disposed in any of multiple locations. For example, in one embodiment, the converter element can be disposed between the lens 406 and the transducer structure 202.

In a particular embodiment shown in FIG. 4D, the SST 200 further includes a thermal pad 404 within the carrier substrate 300. Similar to the conductive material 306 (FIG. 3B), the thermal pad 404 can be deposited into a recess within the carrier substrate 300 at the same time as the conductive material 306. The thermal pad 404 can include various metals, metal alloys, or other thermally conductive materials and can be bonded to the second dielectric portion 229 of the SST 200 with bond pads. Accordingly, the thermal pad 404 can decrease the operating temperature of the SST 200 by transferring heat to a board, a package, a heat sink, or another element of a device that includes the SST 200. Additionally, although the illustrated embodiment of FIG. 4D includes only one thermal pad 404, in other embodiments, the SST 200 may include a plurality of thermal pads 404 having any of a variety of suitable sizes and shapes and located at any of a variety of suitable positions.

Figure 5:
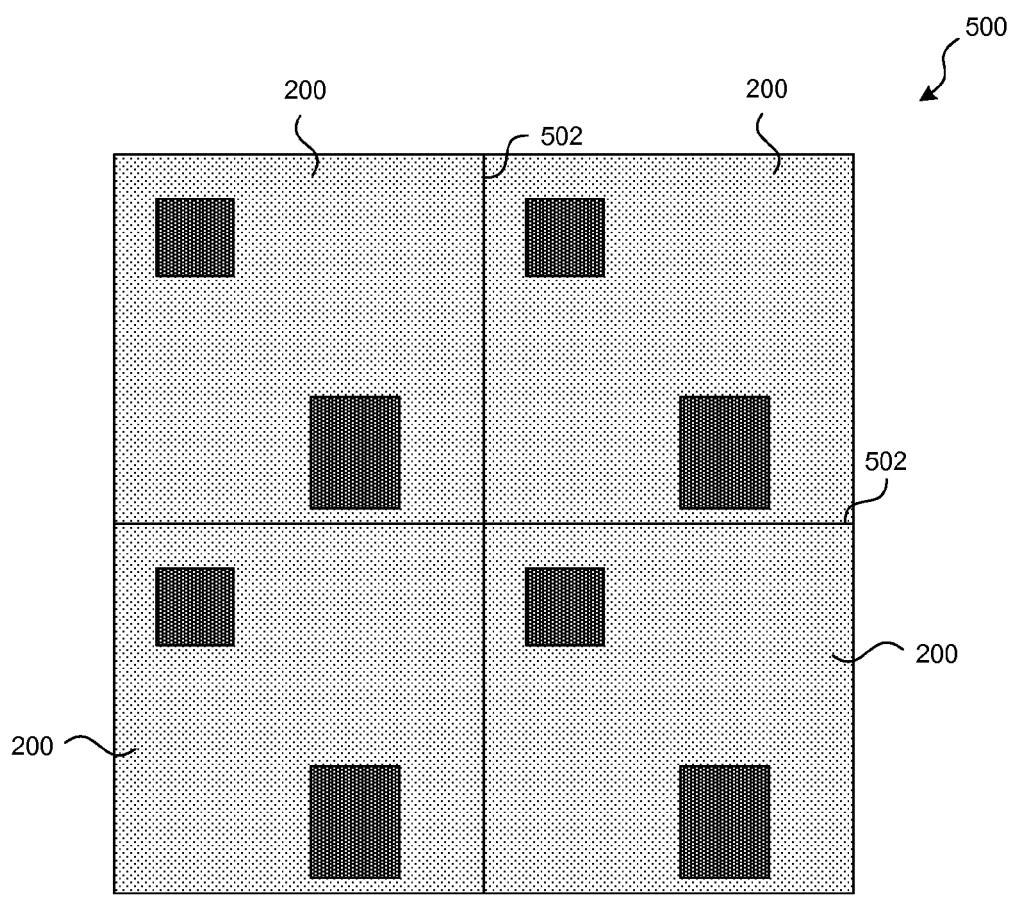
FIG. 5 is a plan view of a wafer level assembly having a plurality of solid-state transducers configured in accordance with yet another embodiment of the present technology.

For illustrative purposes, FIGS. 2A-4D show stages of a fabrication process on an individual SST 200. FIGS. 5-8 show portions of wafer-level assemblies having a plurality of SSTs 200. A person skilled in the art will recognize that each stage of the processes described herein can be performed at the wafer level or at the die level. FIG. 5 is a plan view of a portion of a wafer level assembly 500 including four individual SSTs 200 generally similar to that shown in FIG. 2K. The assembly 500 can be diced along dicing lanes 502 to form singulated SSTs 200, or can be processed to form an SST array, as described below with reference to FIGS. 6A-8.

Figure 6A:
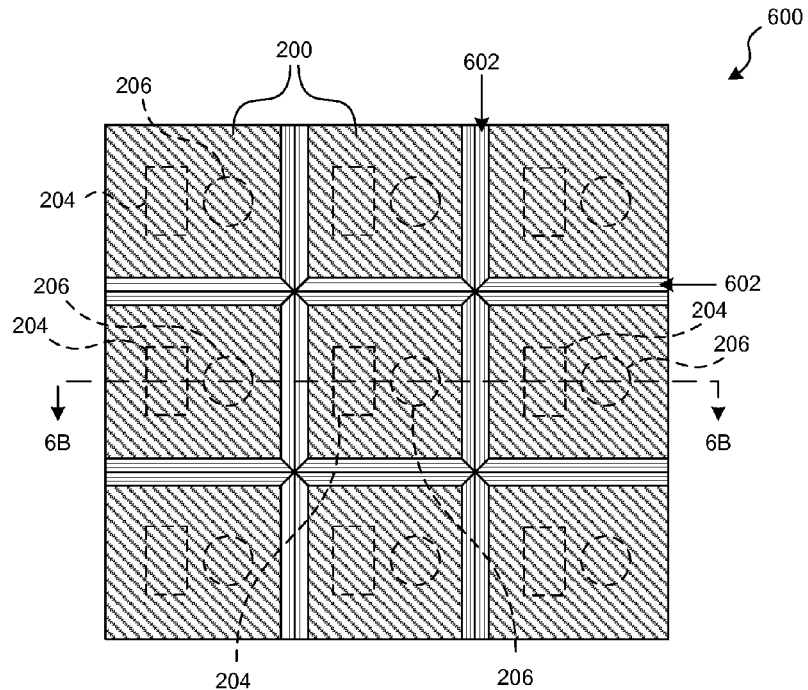
FIGS. 6A and 6B are schematic plan and cross-sectional views of a solid-state transducer array configured in accordance with an embodiment of the present technology.
Figure 6B:
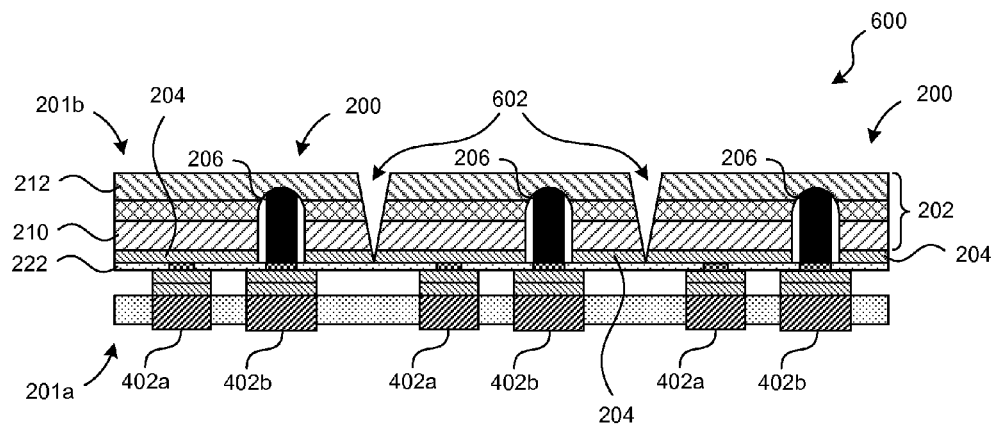

FIGS. 6A and 6B are schematic plan and cross-sectional views, respectively, of a wafer level assembly or SST array 600 having a plurality of trenches 602. The trenches 602 extend inwardly (downwardly in FIG. 6B) from the second side 201b of the array 600 to the dielectric material 222 and divide the array 600 into a plurality of individually controllable SSTs 200. Individual SSTs 200 are accordingly electrically isolated from adjacent SSTs 200 by the trenches 602, and the external contacts 402a, 402b on the first side 201b of the array 600 provide individual electrical paths to the first semiconductor material 210 and to the second semiconductor material 212, for each SST 200. The illustrated embodiment includes only two external contacts 402a, 402b, one first contact 204 and one second contact 206 for each SST 200. In other embodiments, each individual SST 200 can include additional external contacts 402, first contacts 204, second contacts 206, and/or thermal pads. Multiple contacts can provide additional current paths that can reduce current flow through individual paths, and increase SST performance. By reducing current flow along those paths, SSTs can receive higher voltage while maintaining efficiency. Accordingly, the present technology provides for the fabrication of high voltage SSTs.

The array 600 can be constructed at the wafer level in a manner similar to that described above in regard to the SSTs 200 of FIGS. 2A-5. Accordingly, the array 600 provides for an efficient production of individually controllable SSTs on a wafer, and does not require singulating and/or transferring individual SSTs during the production process. Furthermore, individual SSTs 200 of the array 600 can be connected in series. In one embodiment, the array 600 can include a first group of SSTs 200 connected in a first series, and a second group of SSTs connected in a second series. Each of the series can be connected with conductive lines (not shown) that are part of the array 600, or with external components that are not part of the array 600. With appropriate control or logic circuitry, the array 600 can utilize AC power to sequentially energize the first and second groups of SSTs 200.

Figure 7A:
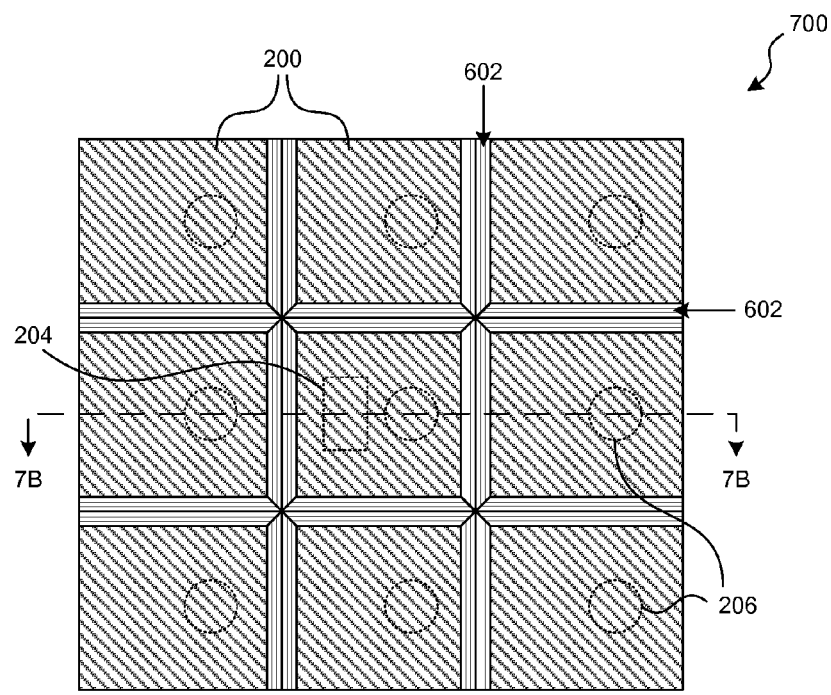
FIGS. 7A and 7B are a schematic plan and cross-sectional views of a solid-state transducer array having a common contact in accordance with a further embodiment of the present technology.
Figure 7B:
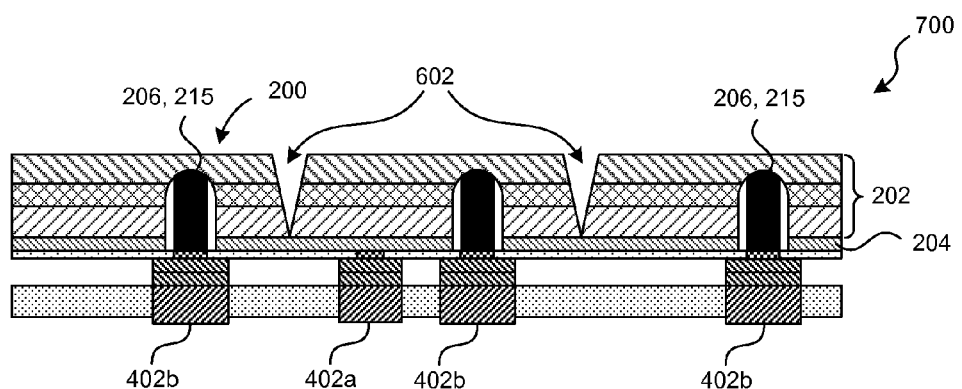

In a further embodiment, an SST array can include a plurality of individually controllable SSTs that share a common contact. FIGS. 7A and 7B are schematic plan and cross-sectional views, respectively, of a wafer level assembly or SST array 700 having a common first contact 204 that is electrically coupled to the first external contact 402a. In the illustrated embodiment, the first contact 204 extends continuously through the array 600 and a plurality of SSTs 200. The trenches 602 divide the array 700 such that the transducer structure 202 of each individual SST 200 is isolated from adjacent SSTs 200. Accordingly, individual SSTs 200 include a second external contact 402b that is electrically coupled to the respective buried contact element 215. Accordingly, the SSTs 200 can be individually controlled by completing a circuit through the corresponding second external contact 402b. Although the illustrated embodiment includes a common first contact 204, in other embodiments, the second contact 206 can be common and the first contact 204 can be individually addressable for each SST 200.

Figure 8:
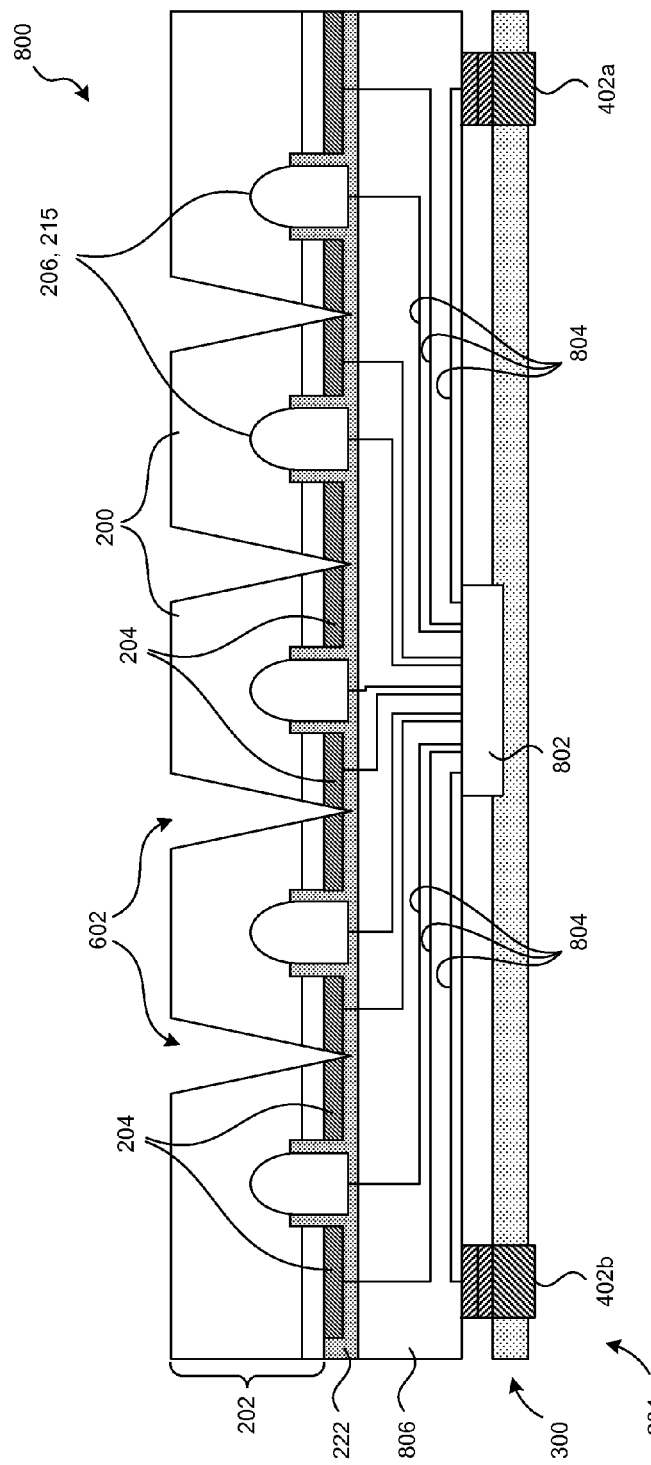
FIG. 8 is a schematic cross-sectional diagram of a solid-state transducer array having an integrated circuit in accordance with yet another embodiment of the present technology.

SST arrays having individually controllable SSTs can include integrated circuits to control the SSTs. FIG. 8 is a schematic cross-sectional view of an SST array 800 having an integrated circuit 802. The array 800 includes a routing section 806, shown schematically. Conductive lines 804 extend through the routing section 806 (e.g., including multiple redistribution layers) and connect the external contacts 402, the first contacts 204 and the second contacts 206 to the integrated circuit 802. Although shown schematically, in an embodiment shown in FIG. 8, the conductive lines 804 can be constructed in a manner similar to the conductive lines 226 and 233 described above with reference to FIGS. 2C, 2D, 2G and 2H. The trenches 602 extend through the transducer structure 202 to the dielectric material 222 and separate the individually addressable SSTs 200. The array 800 can be coupled to a board, a package, or a device with connections made to the external contacts 402. Additional connections (not shown) can be made to the integrated circuit 802 to provide signals to control each individually addressable SST 200. The integrated circuit 802 can include various elements that provide several features to the array 800. Control logic, drivers, and/or additional hardware or software can provide for thermal control, electrostatic protection, overdrive protection, and/or other functions, including powering the SSTs 200 through an AC power supply. Accordingly, the integrated circuit 802 can reduce overheating, reduce electrostatic charge buildup, reduce excessive current, and/or provide other protective or operational functions.

From the foregoing, it will be appreciated that specific embodiments of the technology have been described herein for purposes of illustration, but that various modifications may be made without deviating from the disclosure. The SSTs 200, the assembly 500, and the SST arrays 600, 700 and 800 can include additional components, and/or different combinations of the components described herein. Lenses similar to the lens 406, for example, can be added to each of the individual SSTs of the arrays 600, 700 or 800. Furthermore, the assembly 500 includes a 2×2 array of SSTs, and the arrays 600, 700 and 800 include 3×3 and 5×5 arrays of SSTs. In other embodiments, assemblies and arrays can include different numbers of SSTs and/or have different shapes (e.g., rectangular, circular, etc.). Additionally, certain aspects of the present technology described in the context of particular embodiments may be eliminated in other embodiments. For example, the configuration of the dielectric material 222 and the dielectric portions 228 and 229 can be altered to expose or cover differing combinations of contacts or conductive lines. Additionally, while advantages associated with certain embodiments of the new technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A method of forming solid-state transducers (SSTs), the method comprising:

forming a transducer structure having a first side, a second side facing opposite the first side, a first semiconductor material at the first side and a second semiconductor material at the second side;

forming a first contact at the first side of the transducer structure, the first contact being electrically coupled to the first semiconductor material;

forming a plurality of second contacts, the second contacts electrically coupled to the second semiconductor material and extending from the first side of the transducer structure to the second semiconductor material;

forming a dielectric material on the first contact, the dielectric material having a plurality of openings that expose portions of the first contact;

forming first conductive lines on the dielectric material to connect at least two of the plurality of second contacts;

forming a first conductive material in the openings;

forming second conductive lines, the second conductive lines connecting the first conductive material between individual openings;

forming a carrier substrate having a second conductive material;

bonding the first and second contacts to the second conductive material; and removing a portion of the carrier substrate to expose the second conductive material.

2. The method of claim 1 wherein the second conductive material forms at least a portion of a first external contact and at least a portion of a second external contact, the first external contact electrically coupled to the first contact and the second external contact electrically coupled to at least one of the second contacts.

3. The method of claim 1, further comprising:
forming a first dielectric portion over at least one of the plurality of second contacts; and
forming a second dielectric portion over at least one of the openings.

4. The method of claim 1, further comprising forming a lens on the transducer structure.

5. The method of claim 1 wherein forming SSTs includes forming a plurality of SSTs on a wafer level assembly.

6. The method of claim 1 wherein bonding the first and second contacts to the conductive material includes optically aligning the transducer structure to the carrier substrate.

7. An SST array, comprising:
a transducer structure having a first semiconductor material facing a first direction and a second semiconductor material facing a second direction opposite the first direction, the transducer structure having a plurality of features that separate the transducer structure into a plurality of individually addressable SSTs;
a plurality of first contacts, with individual first contacts electrically coupled to the first semiconductor material;
a plurality of buried second contacts, the second contacts extending through the first semiconductor material along a path electrically insulated from the first semiconductor material, the second contacts being electrically coupled to the second semiconductor material; and
a carrier substrate having a plurality of external contacts, the external contacts facing the second direction.

8. The SST array of claim 7 wherein individual external contacts are electrically coupled to one of the first contacts or to one of the second contacts.

9. The SST array of claim 7, further comprising a dielectric material isolating the plurality of buried second contacts from the first semiconductor material.

10. The SST array of claim 7 wherein each individually addressable SST is coupled to a plurality of the buried second contacts.

11. The SST array of claim 10 wherein the plurality of buried second contacts for an individually addressable SST are connected via conductive lines.

12. The SST array of claim 11, further comprising a first dielectric portion covering at least one of the buried second contacts and at least one of the conductive lines.

13. The SST array of claim 7, further comprising a plurality of conductive lines, with individual conductive lines electrically connecting a first group of SSTs in series and electrically connecting a second group of SSTs in series.

14. A method of forming an SST array, the method comprising:
forming a transducer structure having a first semiconductor material at a first side of the transducer structure and a second semiconductor material at a second side of the transducer structure;
forming a first contact, the first contact electrically coupled to the first semiconductor material;
forming a second contact electrically coupled to the second semiconductor material, the first and the second contact accessible from the first side of the transducer structure;
forming a carrier substrate having a conductive material;
bonding the first and second contacts to the conductive material; and
forming a plurality of trenches in the transducer structure, the plurality of trenches dividing the transducer structure into a plurality of individually addressable SSTs.

15. The method of claim 14 wherein forming a second contact includes forming a plurality of second contacts, with individual second contacts electrically coupled to the second semiconductor material within corresponding individual SSTs.

16. The method of claim 14 wherein forming the first contact includes forming the first contact to be common to multiple individual SSTs.

17. The method of claim 14, further comprising:
forming a routing section, the routing section including a plurality of conductive lines; and
attaching an integrated circuit to the conductive lines.

18. The method of claim 17, further comprising powering the SSTs with an AC power source.

19. The method of claim 14 wherein forming the plurality of trenches further includes forming the plurality of trenches in the first contact, the plurality of trenches dividing the first contact into a plurality of first contacts, with individual first contacts connected to corresponding individual SSTs.

20. An SST array, comprising:
a transducer structure having a first semiconductor material, a second semiconductor material and a plurality of trenches, the first semiconductor material disposed at a first side of the transducer structure and the second semiconductor material disposed at a second side opposite the first side, the plurality of trenches dividing the transducer structure into a plurality of individually addressable SSTs;
a plurality of first contacts, with individual first contacts electrically coupled to the first semiconductor material of corresponding individually addressable SSTs;
a plurality of second contacts, with individual second contacts extending through a corresponding first contact to the second semiconductor material of corresponding individually addressable SSTs, the second contacts electrically coupled to the second semiconductor material;

a dielectric material electrically isolating the individual second contacts from the first semiconductor material and from the individual first contacts; and a carrier having a plurality of first external contacts and a plurality of second external contacts, with individual first external contacts electrically coupled to corresponding individual first contacts and with the individual second external contacts electrically coupled to corresponding individual second contacts, the plurality of first and second external contacts being part of corresponding individual electrical paths for each individually addressable SST.

21. The SST array of claim 20 wherein each of the individually addressable SSTs includes a plurality of the second contacts, and wherein the plurality of the second contacts of an individually addressable SST are electrically coupled together.

22. A method of forming an SST, the method comprising:
forming a transducer structure having a first semiconductor material and a second semiconductor material;
forming a plurality of first contacts, the first contacts electrically coupled to the first semiconductor material;
forming a plurality of second contacts, the second contacts extending through the first semiconductor material along a path electrically insulated from the first semiconductor material, the second contacts being electrically coupled to the second semiconductor material;
forming a carrier substrate having a conductive material;
bonding individual first contacts and individual second contacts to the conductive material;
exposing the conductive material to form a plurality of first external contacts and a plurality of second external contacts; and
forming a plurality of trenches in the transducer structure, the plurality of trenches dividing the SST into a plurality of individually controllable SSTs.

23. The method of claim 22, further comprising electrically coupling the first external contacts and the second external contacts to an AC power source.

24. A method of forming light-emitting diodes (LEDs), the method comprising:
forming a light-emitting transducer structure having a first side, a second side facing opposite the first side, a first semiconductor material at the first side, a second semiconductor material at the second side, and a light-emitting active region between the first semiconductor material and the second semiconductor material;
forming a first contact at the first side of the transducer structure, the first contact being electrically coupled to the first semiconductor material;
forming a plurality of second contacts electrically coupled to the second semiconductor material and extending from the first side of the transducer structure to the second semiconductor material;
forming a dielectric material on the first contact, the dielectric material having a plurality of openings that expose portions of the first contact;
forming first conductive lines on the dielectric material to connect at least two of the plurality of second contacts;
forming a first conductive material in the openings;
forming second conductive lines, the second conductive lines connecting the first conductive material between individual openings;
forming a carrier substrate having a second conductive material;
bonding the first and second contacts to the second conductive material; and
removing a portion of the carrier substrate to expose the second conductive material.

25. The method of claim 24 wherein the second conductive material forms at least a portion of a first external contact and at least a portion of a second external contact, the first external contact electrically coupled to the first contact and the second external contact electrically coupled to at least one of the second contacts.

26. The method of claim 24, further comprising forming a lens on the transducer structure.

27. The method of claim 24 wherein bonding the first and second contacts to the second conductive material includes optically aligning the transducer structure to the carrier substrate.

28. An LED array, comprising:
a light-emitting transducer structure having a first semiconductor material facing a first direction and a second semiconductor material facing a second direction opposite the first direction, the transducer structure having a plurality of features that separate the transducer structure into a plurality of individually addressable LEDs;
a plurality of first contacts, with individual first contacts electrically coupled to the first semiconductor material;
a plurality of buried second contacts, the second contacts extending through the first semiconductor material along a path electrically insulated from the first semiconductor material, the second contacts being electrically coupled to the second semiconductor material; and
a carrier substrate having a plurality of external contacts, the external contacts facing the second direction.

29. The LED array of claim 28 wherein individual external contacts are electrically coupled to one of the first contacts or to one of the second contacts.

30. The LED array of claim 28, further comprising a dielectric material isolating the plurality of buried second contacts from the first semiconductor material.

* * * * *